(12) United States Patent
Mochizuki et al.

(10) Patent No.: US 7,339,971 B2
(45) Date of Patent: Mar. 4, 2008

(54) OPTICAL ELEMENT AND OPTICAL MODULE

(75) Inventors: Masamitsu Mochizuki, Chimo (JP); Yasutaka Imai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 45 days.

(21) Appl. No.: 11/426,444

(22) Filed: Jun. 26, 2006

(65) Prior Publication Data

US 2007/0008997 A1  Jan. 11, 2007

(30) Foreign Application Priority Data

Jul. 8, 2005   (JP) .............................. 2005-200138

(51) Int. Cl.
*H01S 5/00*   (2006.01)
*H01L 31/14*  (2006.01)

(52) U.S. Cl. ............................. 372/50.21; 372/43.01; 257/184; 257/431; 257/E31.097; 257/E31.109

(58) Field of Classification Search ............ 372/50.21, 372/43.01; 257/184, 431, E31.097, E31.109
See application file for complete search history.

(56) References Cited

U.S. PATENT DOCUMENTS

| | | | | |
|---|---|---|---|---|
| 5,107,307 | A * | 4/1992 | Onose et al. | 257/85 |
| 5,216,237 | A * | 6/1993 | Ritchie et al. | 250/214.1 |
| 5,887,013 | A | 3/1999 | Lee et al. | |
| 6,654,518 | B1 * | 11/2003 | Liu | 385/34 |
| 7,239,001 | B2 * | 7/2007 | Pautet et al. | 257/440 |
| 7,242,026 | B2 * | 7/2007 | Fujiwara et al. | 257/79 |
| 7,260,137 | B2 * | 8/2007 | Sato et al. | 372/96 |
| 2005/0152423 | A1 | 7/2005 | Kaneko | |
| 2006/0256825 | A1 * | 11/2006 | Matsumura et al. | 372/43.01 |

FOREIGN PATENT DOCUMENTS

JP   A 10-135568   5/1998

OTHER PUBLICATIONS

Unlu et al.; "Resonant Cavity Enhanced Photonic Devices;" Journal of Applied Physics vol. 28, No. 2, Jul. 1995, pp. 607-639.
Shin et al.; "Vertical-Cavity Surface-Emitting Lasers for Optical Data Storage;" Japan Journal of Applied Physics, vol. 35, 1996, pp. 506-507.

* cited by examiner

*Primary Examiner*—Evan Pert
*Assistant Examiner*—Victor A. Mandala, Jr.
(74) *Attorney, Agent, or Firm*—Oliff & Berridge, PLC

(57) ABSTRACT

An optical element comprising: a surface-emitting type semiconductor laser having an emission surface; and a photodetector element formed above the emission surface of the surface-emitting type semiconductor laser, wherein the photodetector element includes a semiconductor layer having a photoabsorption layer, the semiconductor layer having a film thickness d that satisfies a formula (1) as follows:

$$(2m-1)\lambda/4n - 3\lambda/16n < d < (2m-1)\lambda/4n + 3\lambda/16n \ldots, \quad (1)$$

where m is an integer, n is a refractive index of the semiconductor layer, and λ is a designed wavelength of the surface-emitting type semiconductor laser.

8 Claims, 6 Drawing Sheets

REFLECTOR GLASS PLATE IS PROVIDED     : ♦  14λ / 4n
REFLECTOR GLASS PLATE IS NOT PROVIDED : ■  14λ / 4n
REFLECTOR GLASS PLATE IS PROVIDED     : ▲  15λ / 4n
REFLECTOR GLASS PLATE IS NOT PROVIDED : ✕  15λ / 4n

OPTICAL ELEMENT AND OPTICAL MODULE

The entire disclosure of Japanese Patent Application No. 2005-200138, filed Jul. 8, 2005 is expressly incorporated by reference herein.

BACKGROUND

1. Technical Field

The present invention relates to optical elements and optical modules.

2. Related Art

A surface-emitting type semiconductor laser has characteristics in which its light output changes because temperature dependency occurs in its gain as the temperature of the active layer changes by the influence of surrounding temperatures or the like. For this reason, an optical module that uses a surface-emitting type semiconductor laser may be equipped with a photodetector element that detects a part of laser light emitted from the surface-emitting type semiconductor laser to thereby monitor its light output value. Usually, a photodetector element detects light reflected by a reflector plate that is diagonally provided with respect to an emission direction of the surface-emitting type semiconductor laser.

Also, Japanese Laid Open Patent Application JP-A-10-135568 and non-patent document entitled *Vertical Cavity Surface-Emitting Lasers for Optical Data Storage* (Jpn. J. Appl. Phys, vol. 35 (1996) pp. 506-507) describe optical elements in which a photodetector element is provided on a top of a surface-emitting type semiconductor laser, whereby a part of laser light emitted from the surface-emitting type semiconductor laser can be monitored within the same element. According to the optical element, the reflector plate described above becomes unnecessary, and miniaturization of the optical element and reduction of the alignment cost can be achieved.

However, in such optical elements, the photodetector element may influence the optical characteristics of the surface-emitting type semiconductor laser.

SUMMARY

In accordance with an advantage of some aspects of the present invention, there are provided optical elements and optical modules that can suppress the impact of a photodetector element that may affect optical characteristics of a surface-emitting type semiconductor laser.

An optical element in accordance with an embodiment of the invention includes:

a surface-emitting type semiconductor laser; and a photodetector element formed above an emission surface of the surface-emitting type semiconductor laser, wherein the photodetector element includes a semiconductor layer having a photoabsorption layer, and the semiconductor layer has a film thickness d that satisfies a formula (1) as follows.

$$(2m-1)\lambda/4n - 3\lambda/16n < d < (2m-1)\lambda/4n + 3\lambda/16n \quad (1)$$

It is noted that, in the formula (1), m is an integer, n is a refractive index of the semiconductor layer, and $\lambda$ is a designed wavelength of the surface-emitting type semiconductor laser.

In the description concerning the present invention, the word "above" may be used assuming that the word "above," when used in, for example, "forming a specific object (hereafter referred to as "B") 'above' another specific object (hereafter referred to as "A")," includes a case in which B is formed directly on A, and a case in which B is formed over A through another object.

In the optical element in accordance with an aspect of the present embodiment, the semiconductor layer may have a film thickness that satisfies a formula (2) as follows.

$$(2m-1)\lambda/4n - \lambda/8n < d < (2m-1)\lambda/4n + \lambda/8n \quad (2)$$

It is noted that, in the formula (2), m is an integer, n is a refractive index of the semiconductor layer, and $\lambda$ is a designed wavelength of the surface-emitting type semiconductor laser.

In the optical element in accordance with an aspect of the present embodiment, the film thickness d of the semiconductor layer may be an odd multiple of $\lambda/4n$.

In the optical element in accordance with an aspect of the present embodiment, the surface-emitting type semiconductor laser may have a lower mirror, an active layer formed above the lower mirror, and an upper mirror formed above the active layer, and the semiconductor layer may have a first contact layer formed above the upper mirror, a photoabsorption layer formed above the first contact layer, and a second contact layer formed above the photoabsorption layer.

In accordance with an aspect of the present embodiment, the optical element may further include an isolation layer formed between the surface-emitting type semiconductor laser and the photodetector element.

In accordance with another embodiment of the invention, an optical element includes:

a surface-emitting type semiconductor laser; and a photodetector element formed above an emission surface of the surface-emitting type semiconductor laser, wherein the photodetector element includes a semiconductor layer having a photoabsorption layer, and the semiconductor layer has a film thickness by which a designed wavelength of light of the surface-emitting type semiconductor laser does not coincide with a center wavelength of Fabry-Perot resonance of the semiconductor layers.

In accordance with still another embodiment of the invention, an optical element includes:

a surface-emitting type semiconductor laser; and a photodetector element formed above an emission surface of the surface-emitting type semiconductor laser, wherein the photodetector element includes a semiconductor layer having a photoabsorption layer, and a film thickness d of the semiconductor layer is other than an even multiple of $\lambda/4n$.

In accordance with yet another embodiment of the invention, an optical module includes:

a surface-emitting type semiconductor laser;

a photodetector element formed above an emission surface of the surface-emitting type semiconductor laser; and a light-receiving element that receives light from outside, wherein the photodetector element includes a semiconductor layer having a photoabsorption layer, and the semiconductor layer has a film thickness d that satisfies a formula (1) as follows.

$$(2m-1)\lambda/4n - 3\lambda/16n < d < (2m-1)\lambda/4n + 3\lambda/16n \quad (1)$$

It is noted that, in the formula (1), m is an integer, n is a refractive index of the semiconductor layer, and $\lambda$ is a designed wavelength of the surface-emitting type semiconductor laser.

DESCRIPTION OF EXEMPLARY EMBODIMENTS

Preferred embodiments of the invention are described below with reference to the accompanying drawings.

1. Structure of Optical Element

Figure 1:
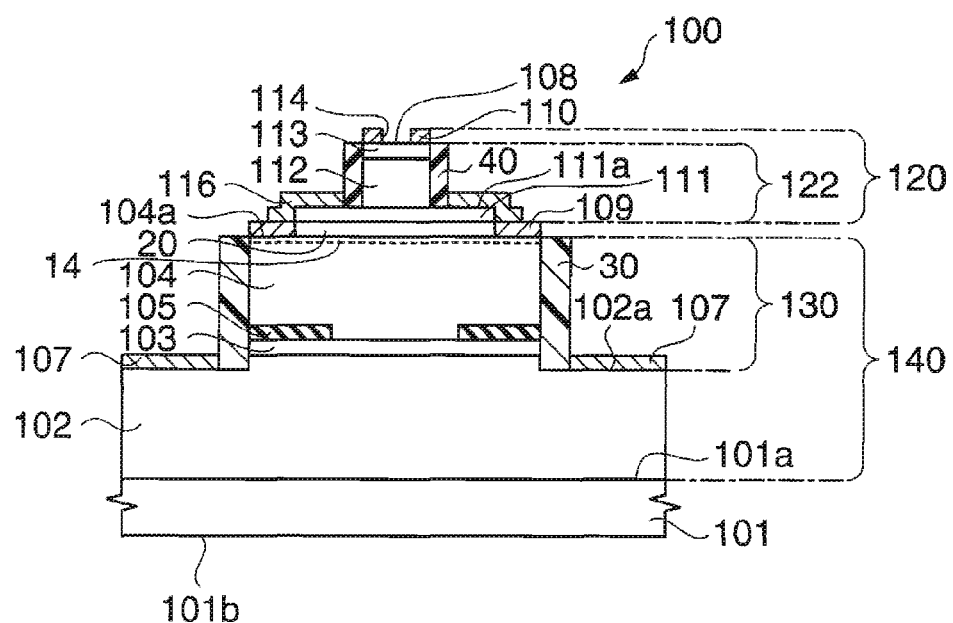
FIG. 1 schematically shows a cross-sectional view of an optical element in accordance with an embodiment of the invention.
Figure 2:
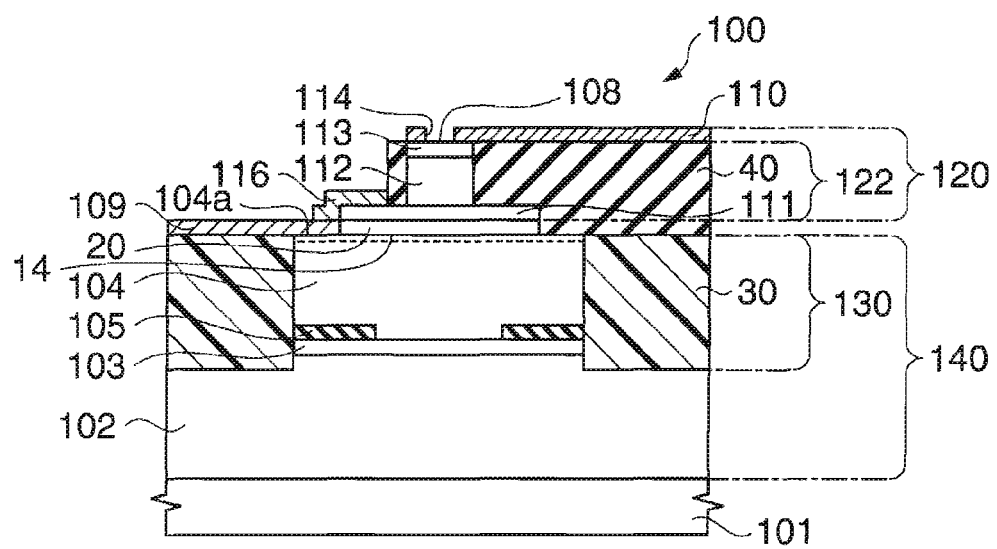
FIG. 2 schematically shows a cross-sectional view of the optical element in accordance with the present embodiment.
Figure 3:
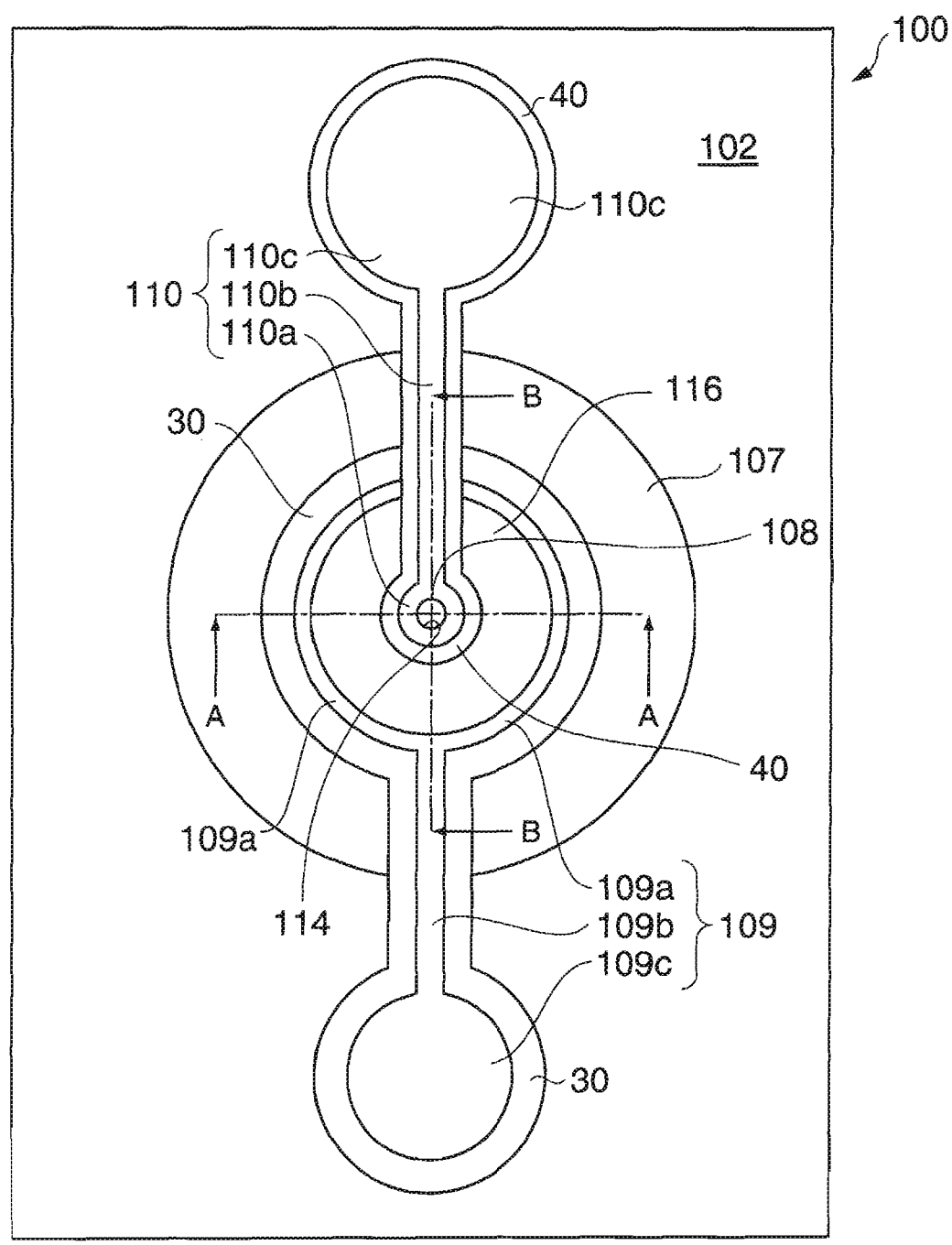
FIG. 3 schematically shows a plan view of the optical element in accordance with the present embodiment.

FIG. 1 and FIG. 2 schematically show cross-sectional views of an optical element 100 in accordance with an embodiment of the present invention. Also, FIG. 3 schematically shows a plan view of the optical element 100 shown in FIG. 1 and FIG. 2. It is noted that FIG. 1 is a view showing a cross section taken along a line A-A in FIG. 3, and FIG. 2 is a view showing a cross section taken along a line B-B in FIG. 3.

The optical element 100 in accordance with the present embodiment includes, as shown in FIG. 1, a surface-emitting type semiconductor laser 140, an isolation layer 20 and a photodetector element 120.

The surface-emitting type semiconductor laser 140, the isolation layer 20, the photodetector element 120 and the overall structure are described below.

1.1. Surface-Emitting Type Semiconductor Laser

The surface-emitting type semiconductor laser 140 is provided on a semiconductor substrate (an n-type GaAs substrate in the present embodiment) 101. The surface-emitting type semiconductor laser 140 has a vertical resonator. Also, the surface-emitting type semiconductor laser 140 may include a columnar semiconductor deposited body (hereafter referred to as a "columnar section") 130.

The surface-emitting type semiconductor laser 140 is formed from, for example, a distributed reflection type multilayer mirror (hereafter referred to as a "first mirror") 102 of 40 pairs of alternately laminated n-type $Al_{0.9}Ga_{0.1}As$ layers and n-type $Al_{0.15}Ga_{0.85}As$ layers, an active layer 103 that is composed of a first $Al_{0.3}Ga_{0.7}As$ barrier layer, a first GaAs well layer on the first $Al_{0.3}Ga_{0.7}As$ barrier layer, a second $Al_{0.3}Ga_{0.7}As$ barrier layer on the first GaAs well layer, a second GaAs well layer on the second. $Al_{0.3}Ga_{0.7}As$ barrier layer, a third $Al_{0.3}Ga_{0.7}As$ barrier layer on the second GaAs well layer, a third GaAs well layer on the third $Al_{0.3}Ga_{0.7}As$ barrier layer and a forth $Al_{0.3}Ga_{0.7}As$ barrier layer on the third GaAs well layer in which the each of GaAs well layers include a quantum well structure composed of a layer, and a distributed reflection type multilayer mirror (hereafter referred to as a "second mirror") 104 of 25 pairs of alternately laminated p-type $Al_{0.9}Ga_{0.1}As$ layers and p-type $Al_{0.15}Ga_{0.85}As$ layers, which are successively laminated. It is noted that the second mirror 104 is composed in such an order that its topmost layer 14 is formed from a layer with a smaller Al composition, in other words, a p-type $Al_{0.5}Ga_{0.85}As$ layer. However, the topmost layer 14 may be formed from a GaAs layer that does not contain Al or an AlGaAs layer that hardly contains Al, because an isolation layer to be described below needs to be selectively etched to expose the surface to make a direct contact with a second electrode 109. It is noted that, even in a configuration in which an isolation layer is not formed, an electric current can be injected more evenly through improving the conductivity of the topmost layer, such that the layer is desirably a uniform layer that does not contain Al even through it accompanies some absorption thereof. Furthermore, the second mirror includes, in a region near the active layer, a layer that becomes to be a layer of $Al_xGa_{1-x}As$ (X>0.95) for forming an oxide aperture. It is noted that the composition of each layer and the number of layers composing the first mirror 102, the active layer 103 and the second mirror 104 may not be limited to the above.

The second mirror 104 is made to be p-type by doping, for example, carbon (C), and the first mirror 102 is made to be n-type by doping, for example, silicon (Si). Accordingly, a pin diode is formed with the p-type second mirror 104, the active layer 103 in which no impurity is doped, and the n-type first mirror 102.

Among the surface-emitting type semiconductor laser 140, a portion extending from the second mirror 104 to an intermediate point of the first mirror 102 is etched in a circular shape as views from an upper surface 104a of the second mirror 104, whereby a columnar section 130 is formed. It is noted that the plane configuration of the columnar section 130, in accordance with the present embodiment, is circular, but the configuration thereof can be in any arbitrary shape.

Also, a first insulation layer 30 that primarily surrounds the columnar section 130 is formed. The first insulation layer 30 may be composed of, for example, polyimide, and is formed on the first mirror 102. Further, the first insulation layer 30 is formed below a lead-out section 109a and a pad section 109c of a second electrode 109 to be described below. Further, the first insulation layer 30 is formed below a second insulation layer 40 to be described below.

Further, a current constricting structure 105, which is obtained by oxidizing an $Al_xGa_{1-x}As$ (X>0.95) from its side surface in a region near the active layer 103 among the layers composing the second mirror 104, is formed. The current constricting structure 105 is formed in, for example, a ring shape. In other words, the current constricting structure 105 may have a cross-sectional configuration which, when cut in a plane parallel with the surface 101a of the semiconductor substrate 101 shown in FIG. 1 and FIG. 2, is in a ring shape defined by circles concentric with the circular shape of the plane configuration of the columnar section 130.

Also, the surface-emitting type semiconductor laser 140 is provided with a first electrode 107 and a second electrode 109. The first electrode 107 and the second electrode 109 are used for driving the surface-emitting type semiconductor laser 140.

Concretely, as shown in FIG. 1, the first electrode 107 is provided on the upper surface 102a of the first mirror 102. The first electrode 107 may have a plane configuration that is, for example, a ring shape shown in FIG. 3. In other words, the first electrode 107 is provided in an arbitrary configuration that surrounds mainly the columnar section 130. In other words, the columnar section 130 is provided inside the first electrode 107.

The second electrode 109 is provided on a top surface 104a of the surface-emitting type semiconductor laser 140. The second electrode 109 has, as shown in FIG. 3, a connecting section 109a having a plane configuration that is, for example, a ring shape, a lead-out section 109b having a linear plane configuration, and a pad section 109c having a circular plane configuration. The second electrode 109 is electrically connected to the second mirror 104 at the connecting section 109a. The lead-out section 109b of the second electrode 109 connects the connecting section 109a and the pad section 109c. The pad section 109c of the second electrode can be used as an electrode pad. The connecting section 109a of the second electrode 109 is provided to surround mainly an isolation layer 20 to be described below. In other words, the isolation layer 20 is provided inside the second electrode 109.

It is noted that, in the present embodiment, a case in which the first electrode 107 is provided on the first mirror 102 is shown, but the first electrode 107 may be provided on a back surface 101b of the semiconductor substrate 101.

The first electrode 107 may be composed of a laminated film of layers of, for example, an alloy of gold (Au) and germanium (Ge), and gold (Au). Also, the second electrode 109 may be composed of a laminated film of layers of, for example, platinum (Pt), titanium (Ti), and gold (Au). An electric current is injected in the active layer 103 by the first electrode 107 and the second electrode 109. It is noted that the materials for forming the first electrode 107 and the second electrode 109 are not limited to those described above, and for example, an alloy of gold (Au) and zinc (Zn) or the like may be used.

1.2. Isolation Layer

In the optical element 100 in accordance with the present embodiment, the isolation layer 20 is formed on the surface-emitting type semiconductor laser 140. In other words, the isolation layer 20 is provided between the surface-emitting type semiconductor laser 140 and a photodetector element 120 to be described below. Concretely, as shown in FIG. 1 and FIG. 2, the isolation layer 20 is formed on the second mirror 104. In other words, the isolation layer 20 is provided between the second mirror 104 and a first contact layer 111 to be described below.

The isolation layer 20 may have a plane configuration that is, for example, a circular shape. In the illustrated example, the plane configuration of the isolation layer 20 is the same as the plane configuration of the first contact layer 111. The plane configuration of the isolation layer 20 may be formed larger than the plane configuration of the first contact layer 111.

By providing the isolation layer 20 in this manner, the semiconductor layer 122 and the columnar section 130 are electrically and optically isolated from each other, and their interface becomes well-defined, such that the film thickness of the semiconductor layer 122 can be more accurately controlled.

1.3. Photodetector Element

The photodetector element 120 is provided on the isolation layer 20. In the optical element 100 in accordance with the present embodiment, the upper surface of the photodetector element 120 includes a laser light emission surface 108.

Also, the photodetector element 120 is equipped with a semiconductor layer 122. The semiconductor layer 122 includes a first contact layer 111, a photoabsorption layer 112 and a second contact layer 113. The first contact layer 111 is provided on the isolation layer 20, the photoabsorption layer 112 is provided on the first contact layer 111, and the second contact layer 113 is provided on the photoabsorption layer 112. The plane configuration of the first contact layer 111 is formed to be larger than the plane configuration of the photoabsorption layer 112 and the second contact layer 113 (see FIG. 1 and FIG. 2). The second contact layer 113 and the photoabsorption layer 112 compose a columnar semiconductor deposited body.

The first contact layer 111 may be composed of, for example, an n-type GaAs layer, the photoabsorption layer 112 may be composed of, for example, a GaAs layer without any impurity being doped, and the second contact layer 113 may be composed of, for example, a p-type GaAs layer. Concretely, the first contact layer 111 is made to be n-type by doping, for example, silicon (Si), and the second contact layer 113 is made to be p-type by doping, for example, carbon (C). Accordingly, a pin diode is formed with the p-type second contact layer 113, the photoabsorption layer 112 in which no impurity is doped, and the n-type first contact layer 111.

The photodetector element 120 is provided with a third electrode 116 and a fourth electrode 110. The third electrode 116 and the fourth electrode 110 are used for driving the photodetector element 120. Concretely, as shown in FIG. 1 and FIG. 2, the third electrode 116 is formed in a manner to cover the first contact layer 111. A portion of the third electrode 116 is formed on the second electrode 109 described above. In other words, the third electrode 116 and the second electrode 109 are electrically connected to each other. As shown in FIG. 3, the third electrode 116 has a plane configuration that is, for example, a ring shape, and is provided in a manner to surround mainly the first contact layer 111 and a second insulation layer 40. In other words, the first contact layer 111 and the second insulation layer 40 are provided inside the third electrode 116.

The fourth electrode 110 has, as shown in FIG. 3, a connecting section 110a having a plane configuration that is, for example, a ring shape, a lead-out section 110b having a linear plane configuration, and a pad section 110c having a circular plane configuration. The fourth electrode 110 is electrically connected to the second contact layer 113 at the connecting section 110a. The lead-out section 110b of the fourth electrode 110 connects the connecting section 110a and the pad section 110c. The pad section 110c of the fourth electrode can be used as an electrode pad. The fourth electrode 110 is provided on an upper surface of the photodetector element 120 (on the second contact layer 113). The fourth electrode 110 is provided with an aperture section 114, and a part of the upper surface of the second contact layer 113 is exposed through the aperture section 114. The exposed surface defines a laser light emission surface 108. Accordingly, by appropriately setting the size of the plane configuration of the aperture section 114, the configuration and the size of the emission surface 108 can be appropriately set. In the present embodiment, as shown in FIG. 3, a case in which the emission surface 108 is in a circular shape is shown.

Also, in the optical element 100 in accordance with the present embodiment, the third electrode 116 may be formed with the same material as that of the first electrode 107, and the fourth electrode 110 may be formed with same material as that of the second electrode 109.

Also, the second insulation layer 40 is formed in a manner to surround mainly the photoabsorption layer 112 and the second contact layer 113. The second insulation layer 40 is formed, as shown in FIG. 1-FIG. 3, over the first contact layer 111, the second mirror 104 and the first insulation layer 30. Furthermore, the second insulation layer 40 is formed below the lead-out section 110b and the pad section 110c of the fourth electrode 110.

The film thickness d of the semiconductor layer 122 is described below.

In general, the light absorption efficiency of the photodetector element 120 improves when the film thickness d of the semiconductor layer 122 is designed to be an even multiple of $\lambda/4n$ (i.e., an integer multiple of $\lambda/2n$), where $\lambda$ is a designed wavelength, and n is a refractive index of the semiconductor layer 122. This is because Fabry-Perot resonance occurs in the semiconductor layer 122 when the semiconductor layer 122 has such a film thickness. However, when Fabry-Perot resonance occurs in the photodetector element 120, light emitted downward from the photodetector element 120 and light emitted from the active layer and reflected downward at a surface of the photodetector element 120 partially cancel out each other, such that the effective reflectivity of the second mirror 104 is reduced, and the light confinement of the surface-emitting type semiconductor laser 140 is deteriorated, whereby its threshold value is elevated.

In view of the above, in the optical element 100 in accordance with the present embodiment, the semiconductor layer 122 has a film thickness by which the wavelength of light oscillated by the surface-emitting type semiconductor laser 140 and the center wavelength of Fabry-Perot resonance described above do not coincide with each other, in other words, Fabry-Perot resonance would hardly occur. In other words, the semiconductor layer 122 has a film thickness of other than an even multiple of $\lambda/4n$.

By this, the occurrence of canceling out of light described above can be suppressed, and the impact of the photodetector element 120 that affects the optical characteristics of the surface-emitting type semiconductor laser 140 can be rather reduced.

Figure 4:
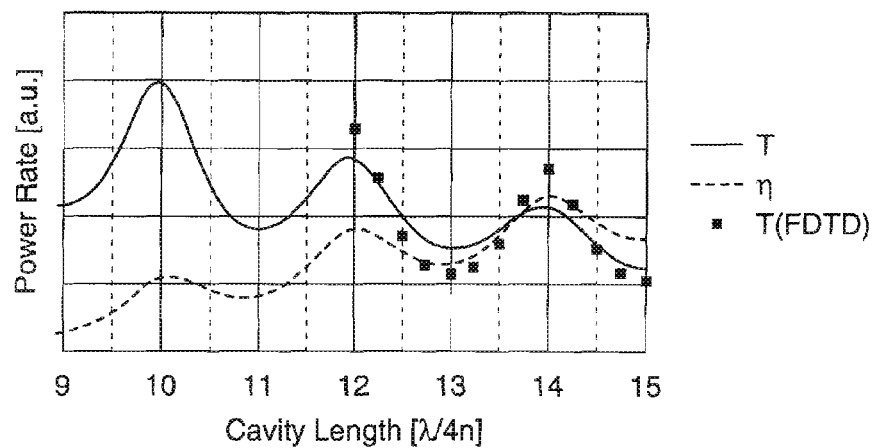
FIG. 4 is a graph showing the relation between film thickness of semiconductor layers, and light transmission rates and absorption amount.

FIG. 4 shows the relation between film thickness of the semiconductor layer 122, rates of light emitted from the semiconductor laser passing through the semiconductor layer 122 and rates of photoabsorption of the semiconductor layer 122. In FIG. 4, the axis of abscissas indicates the film thickness (multiples of $\lambda/4n$) of the semiconductor layer 122, and the axis of ordinates indicates outputs, wherein T and η are transmission rate and absorption efficiency, respectively, assumed from ordinary Fabry-Perot resonance, and T (FDTD) indicates simulation results of transmission rate obtained by the Finite-Difference Time-Domain difference method. Conditions of the optical elements used for simulation are described below.

According to the simulation results of transmission rate in FIG. 4, it is observed that the transmission rate and the absorption efficiency both increase when the film thickness is near even multiples of $\lambda/4n$. In other words, when the film thickness is near even multiples of $\lambda/4n$, light emitted from the semiconductor laser would readily pass through the semiconductor layer 122, and the absorption efficiency at the semiconductor layer is high. In other words, this indicates that the reflectivity of light to the surface-emitting type semiconductor laser 140 at the interface with the semiconductor layer 122 lowers when the film thickness is near even multiples of $\lambda/4n$. The lowered reflectivity at the interface with the semiconductor layer 122 causes a reduction of light to be accumulated in the active layer as described below, and this causes an elevation of the oscillation threshold describe above (see FIG. 7). Also, if returning light from an external medium such as an optical fiber enters the semiconductor layer 122, light reflected upward at an incidence surface (an emission surface 108 of the semiconductor laser) of the returning light and light emitted upward by Fabry-Perot resonance in the semiconductor layer 122 are partially cancelled out, such that the reflectivity of the returning light at the incidence surface 108 is lowered, and the transmission rate of light to the semiconductor layer 122 is elevated. In other words, the influence of returning light on the surface-emitting type semiconductor laser 140 is significant, and therefore the energy in the active layer largely fluctuates according to the phase condition of returning light that is determined by the distance to an external medium (see FIG. 9). Therefore, by setting the semiconductor layer 122 to a film thickness that is other than even multiples of $\lambda/4n$, the impact of the photodetector element 120 on the optical characteristics of the surface-emitting type semiconductor laser 140 can be reduced.

Also, the semiconductor layer 122 may preferably have a film thickness d that satisfies the following formula (1).

$$(2m-1)\lambda/4n - 3\lambda/16n < d < (2m-1)\lambda/4n + 3\lambda/16n \tag{1}$$

where m is an integer, n is a refractive index of the semiconductor layer, and $\lambda$ is a designed wavelength of the surface-emitting type semiconductor laser.

By setting the film thickness d of the semiconductor layer 122 within the range indicated by the above formula (1), the stability of the divergence angle of light emitted from the optical element 100 can be improved.

Figure 5:
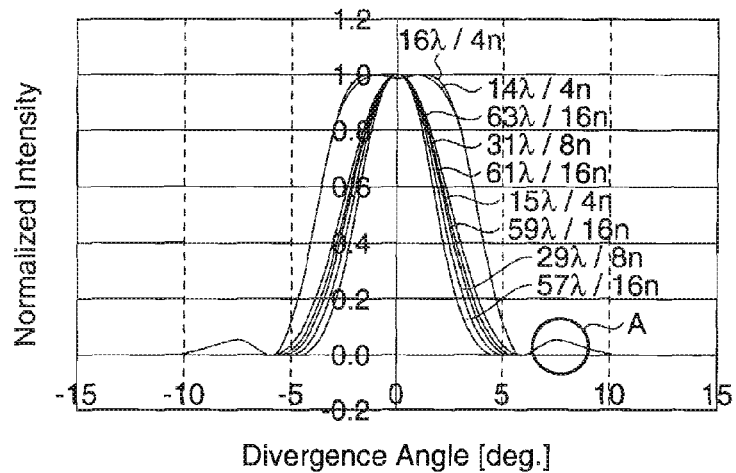
FIG. 5 is a graph showing the relation between film thickness of semiconductor layers and divergence angles.
Figure 6:
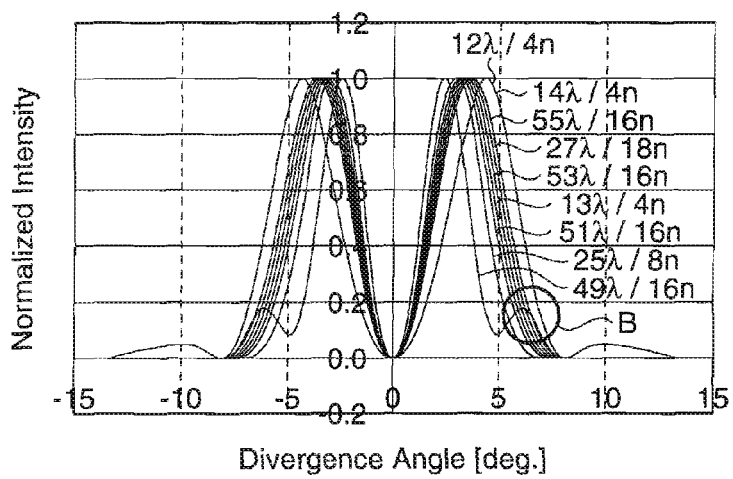
FIG. 6 is a graph showing the relation between film thickness of semiconductor layers and divergence angles.

FIG. 5 shows the relation between film thickness of the semiconductor layer 122 and divergence angles in the $0^{th}$ mode, and FIG. 6 shows the relation between film thickness of the semiconductor layer 122 and divergence angles in the $1^{st}$ mode. In FIG. 5 and FIG. 6, the axis of abscissas indicates divergence angles, and the axis of ordinates indicates light intensity. According to FIG. 5, graphs of $14\lambda/4n$ and $16\lambda/4n$ which are even multiples of $\lambda/4n$ have a side lobe in an area A. Also, according to FIG. 6, a graph of $49\lambda/16n$ has a side lobe in an area B.

In this manner, it is understood from FIG. 5 and FIG. 6 that, when the semiconductor layer 122 has a film thickness of an even multiple of $\lambda/4n$ or a film thickness of an even multiple of $\lambda/4n$ plus $\lambda/16n$, the divergence angle becomes unstable. Accordingly, by setting the film thickness d to the range defined by the formula (1), the divergence angle of light of the optical element 100 can be stabilized.

Also, according to a more preferred embodiment, the semiconductor layer 122 may have a film thickness d that satisfies the following formula (2).

$$(2m-1)\lambda/4n - \lambda/8n < d < (2m-1)\lambda/4n + \lambda/8n \tag{2}$$

where m is an integer, n is a refractive index of the semiconductor layer, and $\lambda$ is a designed wavelength of the surface-emitting type semiconductor laser.

By setting the film thickness d of the semiconductor layer 122 within the range defined by the above formula (2), an elevation of the threshold value of the surface-emitting type semiconductor laser 140 which may be caused by provision of the photodetector element 120 can be suppressed.

Figure 7:
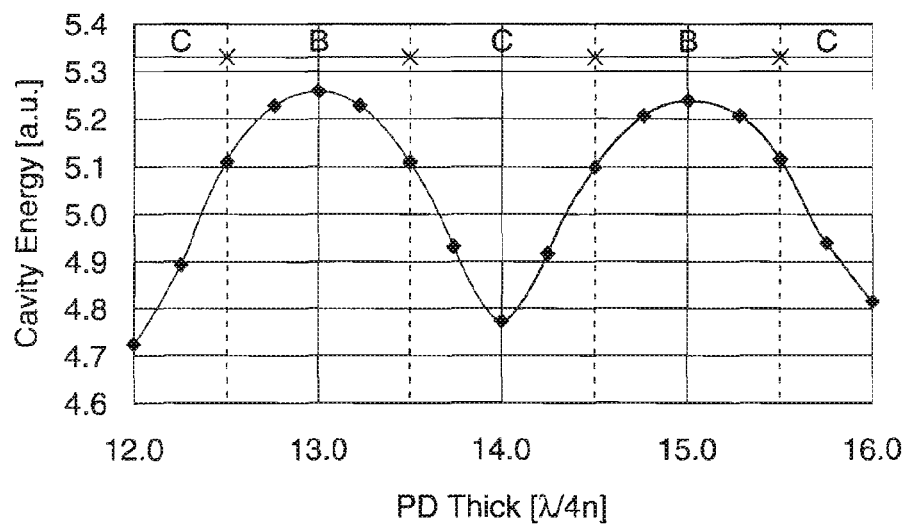
FIG. 7 is a graph showing the relation between film thickness of semiconductor layers and energy within active layers.
Figure 8:
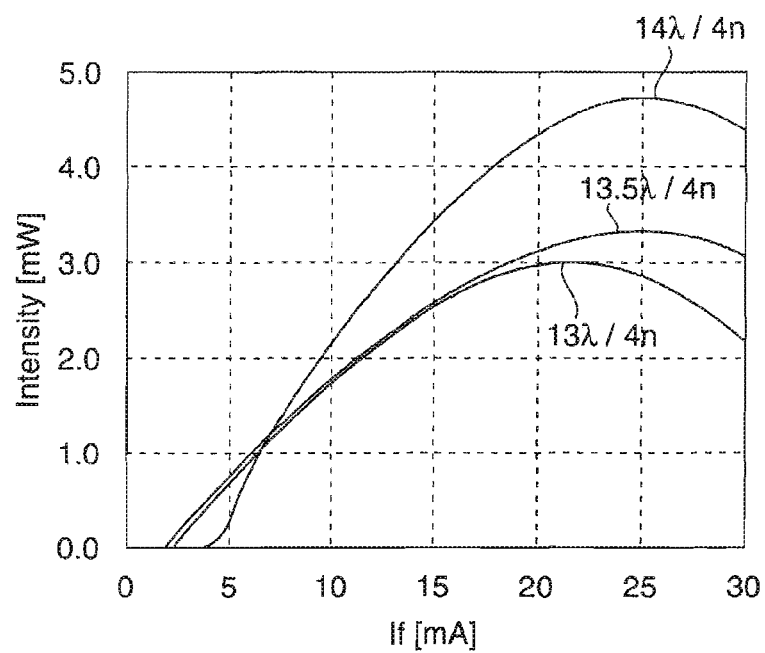
FIG. 8 is a graph showing the relation between film thickness of semiconductor layers and outputs.

FIG. 7 shows the relation between film thickness of the semiconductor layer 122 and light energy, and FIG. 8 shows the relation between film thickness of the semiconductor layer 122 and outputs. In FIG. 7, the axis of abscissas indicates film thickness of the semiconductor layer 122 (multiples of $\lambda/4n$), and the axis of ordinates indicates light energy within the active layer. In FIG. 8, the axis of abscissas indicates currents, and the axis of ordinates indicates outputs.

According to FIG. 7, when the film thickness d of the semiconductor layer 122 is in a region B that is within the range defined by the formula (2), the energy stored within the active layer is still large, but when it is within a region C that is outside the range defined by the formula (2), the energy within the active layer rapidly reduces. According to FIG. 8, it is observed that the thresholds with $13\lambda/4n$ and $13.5\lambda/4n$ which are within the range defined by the formula (2) are smaller, and are about one half of the threshold with $14\lambda/4n$ which is outside the range defined by the formula (2). Accordingly, when the film thickness d of the semiconductor layer 122 is within the range defined by the formula (2), light confinement is excellent and an elevation of the threshold value of the surface-emitting type semiconductor laser 140 can be suppressed, more than the case where it is outside the range defined by the formula (2).

Also, in a more preferred embodiment, the film thickness d of the semiconductor layer 122 may be an odd multiple of $\lambda/4n$. According to FIG. 7, when the film thickness d of the semiconductor layer 122 equals to an odd multiple of $\lambda/4n$, the energy within the active layer reaches a maximum value. Accordingly, when the film thickness d of the semiconductor layer 122 equals to an odd multiple of $\lambda/4n$, an elevation of the threshold value can be more suppressed than the case of other film thicknesses.

Figure 9:
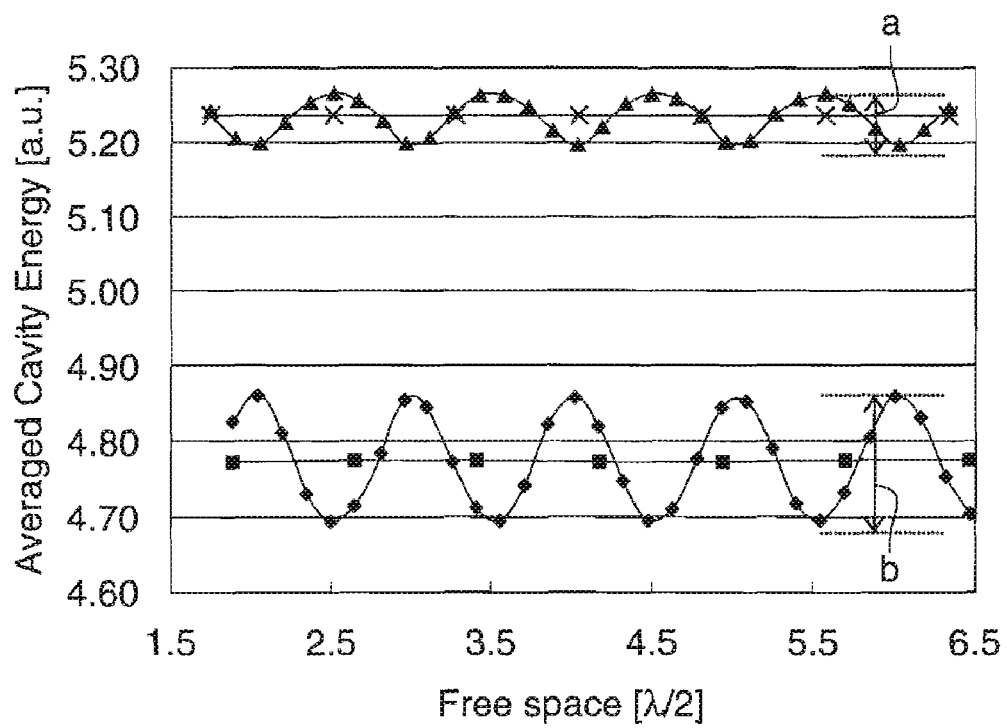
FIG. 9 is a graph showing influences of returning light that affect the energy within active layers with respect to film thickness of semiconductor layers.

Next, impacts of returning light from a reflector glass plate which affect the energy within the active layer, where the reflector glass plate is provided above the optical element 100, are described. FIG. 9 shows the relation between film thickness of the semiconductor layer 122 and impacts of returning light from the reflector glass plate which affect the energy within the active layer. In FIG. 9, the axis of abscissas indicates distance between the emission surface 108 and a reflector glass plate, and the axis of ordinates indicates light energy within the active layer. According to FIG. 9, fluctuation of the energy within the active layer when the film thickness d of the semiconductor layer 122 equals to $15\lambda/4n$ is smaller than fluctuation that occurs when the film thickness d is $14\lambda/4n$. Accordingly, when the semiconductor layer 122 has a film thickness d that equals to an odd multiple of $\lambda/4n$, the influence of returning light from the reflector glass plate which may act upon the surface-emitting type semiconductor laser 140 is smaller than that in the case where the film thickness d equals to an even multiple of $\lambda/4n$.

Conditions of the optical elements used for the simulation to derive the data indicated in FIG. 4 through FIG. 9 are now described. In the optical elements used for the simulation, the first mirror was composed of 37.5 pairs of laminated films with refractive indexes being 3.525 and 3.049, and the second mirror was composed of 25 pairs of laminated films. The side surface of the surface-emitting type semiconductor laser was covered by polyimide (with refractive index being 1.78), the lower surface thereof covered by GaAs (with refractive index being 3.62), and the upper surface thereof covered by air (with refractive index being 1.00). The columnar section had an inclination of 80 degrees, an outer diameter of about 50 μm, and a depth reaching four pairs of films below the active layer. The current constricting layer was provided at the upper side of the lowermost layer of the second mirror, had a refractive index of 1.6, an inner diameter of 13 μm, and a film thickness of 30 nm. The first contact layer provided on an upper surface of the surface-emitting type semiconductor laser was composed of GaAs, and had a refractive index of 3.62, and a film thickness of 58.68 nm. The second electrode and the third electrode had an aperture diameter of 31 μm, and a film thickness that equals to one pair of mirror films. The second contact layer was composed of GaAs, and had a refractive index of 3.62, and a film thickness of 117.4 nm. The fourth electrode had an aperture diameter of 25 μm, and a film thickness that equals to one pair of mirror films. The sum of film thickness of the first contact layer, the photoabsorption layer and the second contact layer was set to $\lambda/16n \times 36, 37, \ldots$, and 52.

1.4. Overall Structure

In the optical element 100 in accordance with the present embodiment, the n-type first mirror 102 and the p-type second mirror 104 of the surface-emitting type semiconductor laser 140, and the n-type first contact layer 111 and the p-type second contact layer 113 of the photodetector element 120 form a npnp structure as a whole.

The photodetector element 120 has a function to monitor outputs of light generated by the surface-emitting type semiconductor laser 140. More concretely, the photodetector element 120 converts light generated by the surface-emitting type semiconductor laser 140 into electric current. With the electric current value, outputs of light generated by the surface-emitting type semiconductor laser 140 can be detected.

More concretely, in the photodetector element 120, a part of light generated by the surface-emitting type semiconductor laser 140 is absorbed by the photoabsorption layer 112, and photoexcitation is caused by the absorbed light in the photoabsorption layer 112, whereby electrons and holes are generated. Then, when an electric field is applied from an outside element, the electrons move to the third electrode 116 and the holes move to the fourth electrode 110, respectively. As a result, an electric current is generated in the direction from the first contact layer 111 to the second contact layer 113 in the photodetector element 120.

Also, light output of the surface-emitting type semiconductor laser 140 is determined mainly by a bias voltage applied to the surface-emitting type semiconductor laser 140. In particular, light output of the surface-emitting type semiconductor laser 140 greatly changes depending on the ambient temperature of the surface-emitting type semiconductor laser 140 and the service life of the surface-emitting type semiconductor laser 140. For this reason, it is necessary for the surface-emitting type semiconductor laser 140 to maintain a predetermined level of light output.

In the optical element 100 in accordance with the present embodiment, light output of the surface-emitting type semiconductor laser 140 is monitored, and the value of a voltage to be applied to the surface-emitting type semiconductor laser 140 is adjusted based on the value of an electric current generated by the photodetector element 120, whereby the value of an electric current circulating within the surface-emitting type semiconductor laser 140 can be adjusted. Accordingly, a predetermined level of light output can be maintained in the surface-emitting type semiconductor laser 140. The control to feed back the light output of the surface-emitting type semiconductor laser 140 to the value of a voltage to be applied to the surface-emitting type semiconductor laser 140 can be performed by using an external electronic circuit (a drive circuit not shown).

2. Method for Manufacturing Optical Element

First, on a surface 101a of a semiconductor substrate 101 composed of an n-type GaAs layer, a semiconductor multilayer film of multiple layers is formed by epitaxial growth while modifying its composition. A metal-organic chemical vapor phase deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Then, the layers of the multilayer film are successively patterned into predetermined configurations, and a current constricting structure 105 is formed by oxidizing a second mirror 104 from its side surface. Then, insulation layers 30 and 40 and electrodes are formed, whereby an optical element 100 can be formed.

3. Optical Module

Figure 10:
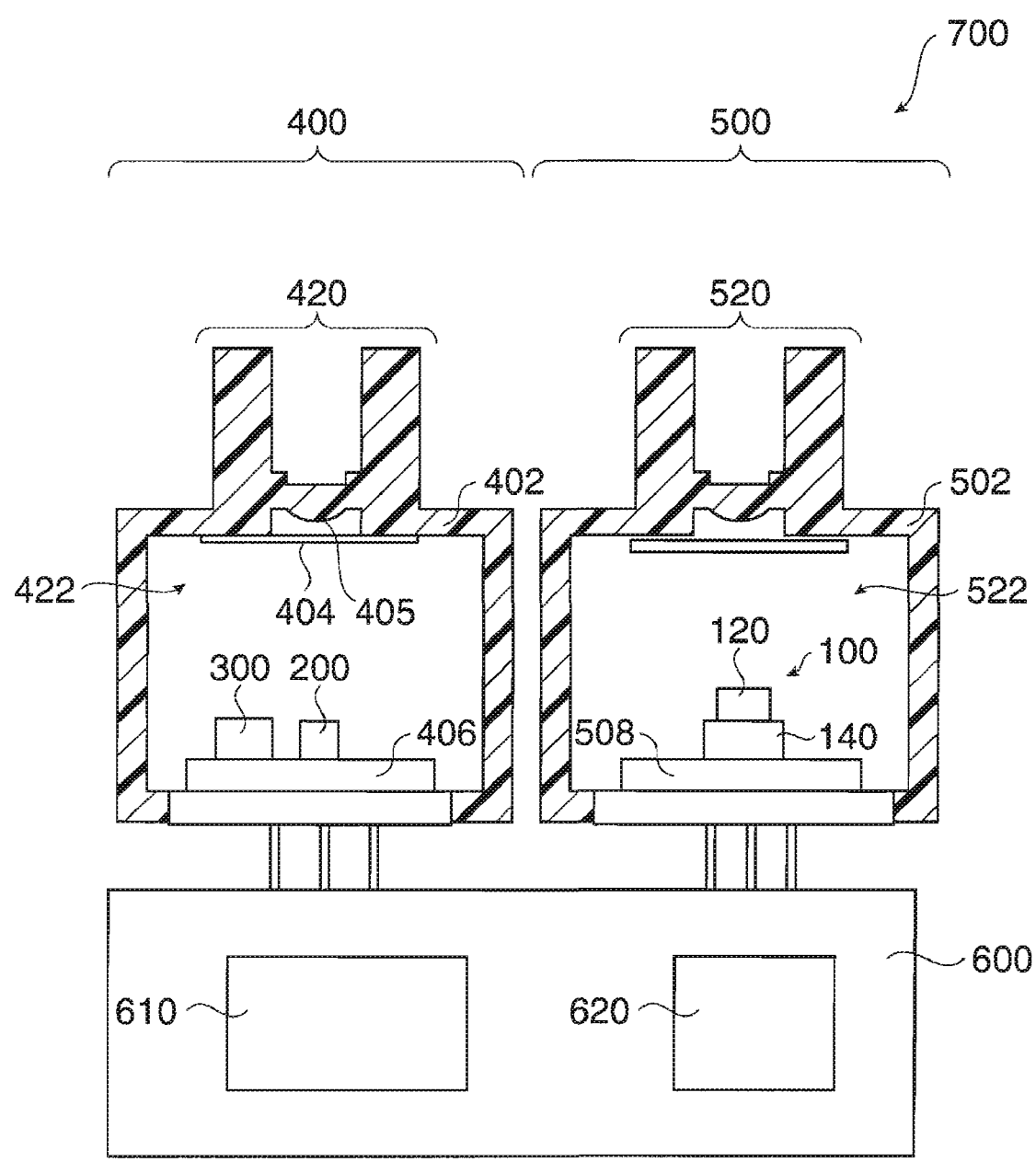
FIG. 10 schematically shows a cross-sectional view of an optical module in accordance with another embodiment of the invention.

Next, an optical module to which a photoelectron integrated device in accordance with the present invention is described with reference to FIG. 10. FIG. 10 is a schematic cross-sectional view of an optical module 700 in accordance with an embodiment. The optical module 700 shown in FIG. 10 is provided with an optical element 100 in accordance with an embodiment of the invention.

The optical module 700 includes a reception section 400, a transmission section 500, and an electronic circuit section 600. The electronic circuit section 600 includes an amplifier circuit section 610 and a drive circuit section 620.

The reception section 400 includes a substrate 406, a light receiving element 200, a heterojunction bi-polar transistor 300, a housing section 402 and a glass plate 404.

The housing section 402 is formed with, for example, a resin material, and is formed in one piece with a sleeve 420 and a focusing section 405 to be described below. As the resin material, a material that is capable of transmitting light may be selected. For example, polymethyl methacrylate (PMMA) used for plastic optical fibers (POF), epoxy resin, phenol resin, diallylphthalate, phenyl methacrylate, fluorine type polymer, and the like can be used.

The sleeve 420 is formed in a manner that an optical conductive member (not shown) such as an optical fiber can be inserted from outside, and composes a portion of a circumferential wall of a housing space 422. The focusing section 405 is provided on the side of the housing space 422 of the sleeve 420, and focuses an optical signal from the light conductive member and sends out the same. By this, the loss of light from the optical conductive member can be lowered, and the optical coupling efficiency between the light receiving element 200 and the optical conductive member can be made better.

The transmission section 500 includes a sub-mount substrate 508, an optical element 100, and a housing section 502. The optical element 100 is disposed on the sub-mount substrate 508.

The surface-emitting type semiconductor laser 140 of the optical element 100 converts an electric signal inputted from outside into an optical signal, and outputs the same externally through a light conductive material (not shown). The light receiving element 200 receives an optical signal through an optical conductive member, converts the same into an electric current, and sends the converted electric current to the heterojunction bi-polar transistor 300. The heterojunction bi-polar transistor 300 converts the received electric current to the electric voltage, amplifies the same, and sends the same to the electronic circuit section 600. The amplification circuit section 610 controls the voltage output such that it does not exceed a specified level, and outputs the same externally. It is noted that descriptions of external terminals such as output terminals and input terminals for electric signals are omitted. In this manner, the optical element 100 is used in the optical module 700.

According to the optical element 100 in accordance with the present embodiment, the photodetector element 120 is provided on the surface-emitting type semiconductor laser 140, such that the optical module 700 does not require being equipped with a diagonal glass section on the side of the housing space 522 of the sleeve 520, and therefore miniaturization of the device and reduction of the cost can be realized.

Preferred embodiments of the invention are described above. However, the present invention is not limited to them, and a variety of modes can be implemented.

What is claimed is:

1. An optical element comprising:
   a surface-emitting type semiconductor laser having an emission surface; and
   a photodetector element formed above the emission surface of the surface-emitting type semiconductor laser, wherein
   the photodetector element includes a semiconductor layer having a photoabsorption layer, the semiconductor layer having a film thickness d that satisfies a formula (1) as follows, $$(2m-1)\lambda/4n - 3\lambda/16n < d < (2m-1)\lambda/4n + 3\lambda/16n \tag{1}$$

where m is an integer, n is a refractive index of the semiconductor layer, and λ is a designed wavelength of the surface-emitting type semiconductor laser.

2. An optical element according to claim 1, wherein the semiconductor layer has a film thickness d that satisfies a formula (2) as follows, $$(2m-1)\lambda/4n - \lambda/8n < d < (2m-1)\lambda/4n + \lambda/8n \tag{2}$$

where m is an integer, n is a refractive index of the semiconductor layer, and λ is a designed wavelength of the surface-emitting type semiconductor laser.

3. An optical element according to claim 1, wherein, when λ is a designed wavelength of the surface-emitting type semiconductor laser, and n is a refractive index of the semiconductor layer, a film thickness d of the semiconductor layer is an odd multiple of λ/4n.

4. An optical element according to claim 1, wherein
   the surface-emitting type semiconductor laser has a lower mirror, an active layer formed above the lower mirror, and an upper mirror formed above the active layer, and
   the semiconductor layer has a first contact layer formed above the upper mirror, a photoabsorption layer formed above the first contact layer, and a second contact layer formed above the photoabsorption layer.

5. An optical element according to claim 1, further comprising an isolation layer formed between the surface-emitting type semiconductor laser and the photodetector element.

6. An optical module comprising:
   the optical element according to claim 1; and
   a light-receiving element that receives light from outside.

7. An optical element comprising:
   a surface-emitting type semiconductor laser having an emission surface; and a photodetector element formed above the emission surface of the surface-emitting type semiconductor laser, wherein the photodetector element includes a semiconductor layer having a photoabsorption layer, and the semiconductor layer has a film thickness by which a designed wavelength of light of the surface-emitting type semiconductor laser does not coincide with a center wavelength of Fabry-Perot resonance.

8. An optical element comprising: a surface-emitting type semiconductor laser having an emission surface; and a photodetector element formed above the emission surface of the surface-emitting type semiconductor laser, wherein the photodetector element includes a semiconductor layer having a photoabsorption layer, and a film thickness d of the semiconductor layer is other than an even multiple of $\lambda/4n$, where the multiple is not equal to 1 and where $\lambda$ is a designed wavelength of the surface-emitting type semiconductor laser, and n is a refractive index of the semiconductor layer.

* * * * *